(12) United States Patent
Sadayori

(10) Patent No.: US 11,508,893 B2
(45) Date of Patent: Nov. 22, 2022

(54) METHOD OF PRODUCING SEMICONDUCTOR SINTERED BODY

(71) Applicant: NITTO DENKO CORPORATION, Ibaraki (JP)

(72) Inventor: Naoki Sadayori, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 11 days.

(21) Appl. No.: 16/612,466

(22) PCT Filed: May 17, 2018

(86) PCT No.: PCT/JP2018/019159
§ 371 (c)(1),
(2) Date: Nov. 11, 2019

(87) PCT Pub. No.: WO2018/212295
PCT Pub. Date: Nov. 22, 2018

(65) Prior Publication Data
US 2020/0098966 A1 Mar. 26, 2020

(30) Foreign Application Priority Data

May 19, 2017 (JP) .............................. JP2017-100107
May 19, 2017 (JP) .............................. JP2017-100108
Oct. 13, 2017 (JP) .............................. JP2017-199057

(51) Int. Cl.
| | | |
|---|---|---|
| *H01L 35/18* | (2006.01) | |
| *H01L 35/22* | (2006.01) | |
| *H01L 35/34* | (2006.01) | |
| *H01L 35/26* | (2006.01) | |
| *H01L 35/24* | (2006.01) | |
| *H01L 35/28* | (2006.01) | |
| *C01B 33/06* | (2006.01) | |
| *B28B 11/24* | (2006.01) | |
| *B22F 3/10* | (2006.01) | |
| *B22F 3/105* | (2006.01) | |
| *B82Y 30/00* | (2011.01) | |

(52) U.S. Cl.
CPC ............ *H01L 35/18* (2013.01); *B22F 3/1003* (2013.01); *B22F 3/105* (2013.01); *B28B 11/243* (2013.01); *C01B 33/06* (2013.01); *H01L 35/22* (2013.01); *H01L 35/24* (2013.01); *H01L 35/26* (2013.01); *H01L 35/28* (2013.01); *H01L 35/34* (2013.01); *B82Y 30/00* (2013.01); *C01P 2002/54* (2013.01); *C01P 2002/60* (2013.01); *C01P 2004/04* (2013.01); *C01P 2004/61* (2013.01); *C01P 2006/32* (2013.01); *C01P 2006/40* (2013.01)

(58) Field of Classification Search
CPC ......... H01L 35/22; H01L 35/26; H01L 35/28; H01L 35/34; H01L 35/24
See application file for complete search history.

(56) References Cited

U.S. PATENT DOCUMENTS

| | | | |
|---|---|---|---|
| 7,002,071 | B1 | 2/2006 | Sadatomi et al. |
| 2003/0032709 | A1 | 2/2003 | Toshima et al. |
| 2006/0102224 | A1 | 5/2006 | Chen et al. |
| 2008/0173344 | A1 | 7/2008 | Zhang et al. |
| 2008/0202575 | A1 | 8/2008 | Ren et al. |
| 2010/0051081 | A1 | 3/2010 | Iida et al. |
| 2012/0118343 | A1 | 5/2012 | Iida et al. |
| 2012/0282435 | A1 | 11/2012 | Yang et al. |
| 2014/0116491 | A1 | 5/2014 | Reifenberg et al. |
| 2014/0360546 | A1 | 12/2014 | Reifenberg et al. |
| 2015/0069284 | A1 | 3/2015 | Murai et al. |
| 2015/0357543 | A1 | 12/2015 | Yabuuchi et al. |
| 2016/0072033 | A1 | 3/2016 | Carberry |
| 2016/0359096 | A1* | 12/2016 | Yang .................. H01L 35/32 |
| 2018/0033939 | A1 | 2/2018 | Kwon et al. |
| 2018/0175272 | A1* | 6/2018 | Imai .................... H01L 35/30 |
| 2018/0212131 | A1 | 7/2018 | Kikuchi et al. |

FOREIGN PATENT DOCUMENTS

| | | |
|---|---|---|
| CN | 101226983 A | 7/2008 |
| EP | 1083610 A1 | 3/2001 |
| JP | H07-38156 A | 2/1995 |
| JP | 2000-261044 A | 9/2000 |
| JP | 2000-261045 A | 9/2000 |
| JP | 2001-068744 A | 3/2001 |
| JP | 2003-046145 A | 2/2003 |
| JP | 2006-176859 A | 7/2006 |
| JP | 2008-523579 A | 7/2008 |
| JP | 2011-503878 A | 1/2011 |
| JP | 2011-49538 A | 3/2011 |
| JP | 2011-249742 A | 12/2011 |
| JP | 2012-190984 A | 10/2012 |
| JP | 2012-253229 A | 12/2012 |

(Continued)

OTHER PUBLICATIONS

Extended European Search Report issued for European Patent Application No. 18803227.0 dated Jan. 27, 2021.

(Continued)

*Primary Examiner* — Golam Mowla
(74) *Attorney, Agent, or Firm* — Hauptman Ham, LLP

(57) ABSTRACT

A semiconductor sintered body comprising a polycrystalline body, wherein the polycrystalline body comprises silicon or a silicon alloy, and the average grain size of the crystal grains constituting the polycrystalline body is 1 μm or less, and the electrical conductivity is 10,000 S/m or higher.

5 Claims, No Drawings

(56) References Cited

FOREIGN PATENT DOCUMENTS

| | | | |
|---|---|---|---|
| JP | 2013-179322 A | 9/2013 | |
| JP | 2015-056491 A | 3/2015 | |
| JP | 2016-504756 A | 2/2016 | |
| JP | 5941562 B2 | 6/2016 | |
| JP | 2016-131232 A | 7/2016 | |
| JP | 2016-528716 A | 9/2016 | |
| JP | 2016-219666 A | 12/2016 | |
| KR | 10-2009-0107491 A | 10/2009 | |
| KR | 10-2016-0018657 A | 2/2016 | |
| KR | 10-2017-0011159 A | 2/2017 | |
| WO | 2008/075789 A1 | 6/2008 | |
| WO | 2014/118959 A1 | 8/2014 | |
| WO | 2017/014583 A1 | 1/2017 | |
| WO | WO-2017038324 A1 * | 3/2017 | ............. H01L 35/22 |
| WO | 2017/057237 A1 | 4/2017 | |

OTHER PUBLICATIONS

Extended European Search Report issued for European Patent Application No. 18802437.6 dated Jan. 27, 2021.
Extended European Search Report issued for European Patent Application No. 18803228.8 dated Jan. 27, 2021.
Sabah K. Bux et al., "Nanostructured Bulk Silicon as an Effective Thermoelectric Material", Advanced Functional Materials, 2009, p. 2445-p. 2452, vol. 19, InterScience, Weinheim, cited in the Specification.
Koya Arai et al., "Fabrication of Mg2Si bulk by spark plasma sintering method with Mg2Si nano-powder", Materials Research Society Symo, 2013, p. 63-p. 68, vol. 1490, DOI:10.1557/opl.2012.1732, Department of Materials Science and Technology, Japan.
International Search Report for corresponding international application PCT/JP2018/019159 dated Jul. 24, 2018.
International Search Report for corresponding international application PCT/JP2018/019160 dated Jul. 24, 2018.
International Search Report for corresponding international application PCT/JP2018/019161 dated Jul. 24, 2018.
Office Action issued for related U.S. Appl. No. 16/612,850 dated Mar. 23, 2021.
Office Action dated Sep. 2, 2021, for corresponding Taiwanese Patent Application No. 107117015, along with an English translation.
Office Action dated Sep. 2, 2021, for corresponding Taiwanese Patent Application No. 107117013, along with an English translation.
Office Action dated Sep. 2, 2021, for corresponding Taiwanese Patent Application No. 107117012, along with an English translation.
Office Action dated Sep. 29, 2021, for corresponding U.S. Appl. No. 16/612,850.
Schierning et al., "Role of oxygen on microstructure and thermoelectric properties of silicon nanocomposites", Journal of Applied Physics 110, 113515 (2011).
Kasiarova et al., "Microstructure and Creep Behavior of a Si3N4-SiC Micronanocomposite", Journal of the American Ceramic Society, vol. 92, No. 2, (2009), pp. 439-444.
Zhu et al., "Increased Phonon Scattering by Nanograins and Point Defects in Nanostructured Silicon with a Low Concentration of Germanium", Physical Review Letters, 102, 196803 (2009).
Kajikawa et al., "Thermoelectric Figure of Merit of Impurity Doped and Hot-pressed Magnesium Silicide Elements", 17th International Conference on Thermoelectrics (1998), Proceedings ICT98 (Cat. No. 98TH8365), Date of Conference: May 28-28, 1998, pp. 362-369.
Office Action dated Mar. 15, 2022 for corresponding Japanese Patent Application No. 2018-095174, along with an English machine translation.
Fiameni et al., "Synthesis and characterization of Bi-doped Mg2Si thermoelectric materials", Journal of Solid State Chemistry 193 (2012), pp. 142-146.
Vivekanandhan et al., "Rapid in-situ synthesis of nanocrystalline magnesium silicide thermo-electric compound by spark plasma sintering", Materials Letters 197 (Mar. 23, 2017), pp. 106-110.
Office Action dated May 6, 2022, for corresponding Taiwanese Patent Application No. 107117012, along with an English translation.
Office Action dated May 17, 2022, for corresponding Taiwanese Patent Application No. 107117015, along with an English translation.
Sabah K. Bux et al., "Mechanochemical synthesis and thermoelectric properties of high quality magnesium silicide", Journal of Materials Chemistry, 2011, vol. 21, pp. 12259-12266.
Aikebaier Yusufu et al., "Bottom-up nanostructured bulk silicon: a practical high-efficiency thermoelectric material", Nanoscale, 2014, vol. 6, pp. 13921-13927.
Dario Narducci et al., "Silicon de novo: energy filtering and enhanced thermoelectric performances of nanocrystalline silicon and silicon alloys", Journal of Materials Chemistry C, 2015, vol. 3, pp. 12176-12185.
Office Action dated Jun. 30, 2022, for corresponding Korean Patent Application No. 10-2019-7033738 along with an English machine translation.
Office Action dated Jun. 30, 2022, for corresponding Korean Patent Application No. 10-2019-7033739 along with an English machine translation.
Office Action dated Jun. 30, 2022, for corresponding Korean Patent Application No. 10-2019-7033740 along with an English machine translation.
Japanese Office Action dated Jun. 21, 2022 in connection with the Japanese Patent Application No. 2018-095172.
Japanese Office Action dated Jun. 21, 2022 in connection with the Japanese Patent Application No. 2018-095173.

* cited by examiner

METHOD OF PRODUCING SEMICONDUCTOR SINTERED BODY

CROSS REFERENCE TO RELATED APPLICATION

This application claims the priority of Japanese Patent Application No. 2017-100107, filed on May 19, 2017 and Japanese Patent Application No. 2017-100108, filed on May 19, 2017 and Japanese Patent Application No. 2017-199057, filed on Oct. 13, 2017 in the JPO (Japanese Patent Office). Further, this application is the National Phase Application of International Application No. PCT/JP2018/019159, filed on May 17, 2018, which designates the United States and was published in Japan. Both of the priority documents are hereby incorporated by reference in their entireties.

TECHNICAL FIELD

The present invention relates to a method of producing a semiconductor sintered body, an electrical/electronic member, and a semiconductor sintered body.

BACKGROUND ART

Semiconductors can generate a high electromotive force per temperature difference (i.e., have a high Seebeck coefficient), and thus are known as useful thermoelectric materials for thermoelectric power generation. Among the semiconductors, silicon-based materials have recently attracted attention due to their lower toxicity, availability at lower cost, and ease of controlling electrical properties.

To provide a higher thermoelectric performance, the thermoelectric material is required to have a higher electrical conductivity and a lower thermal conductivity. However, silicon has a high thermal conductivity, and therefore the silicon-based material may not necessarily show sufficient thermoelectric performance.

In light of the above, nanostructuring by sintering nanosized silicon particles, etc., which is a technique to reduce a thermal conductivity, has been known (Patent Literature 1 and Non-Patent Literature 1).

CITATION LIST

Patent Literature

Patent Literature 1: Specification of U.S. Patent Publication No. 2014/0360546

Non Patent Literature

Non Patent Literature 1: Bux et al., Adv. Funct. Mater., 2009, 19, p. 2445-2452

SUMMARY OF INVENTION

Technical Problem

The nanostructuring as described in Patent Literature 1 and Non Patent Literature 1 can reduce the thermal conductivity of the material, but may also reduce the electrical conductivity. Therefore, the thermoelectric performance of the silicon-based material may still be insufficient.

In view of the above, it is an object of one embodiment of the present invention to provide a semiconductor material having an increased electrical conductivity and maintaining a reduced thermal conductivity, to achieve an improvement in the thermoelectric performance.

Solution to Problem

An embodiment of the present invention provides a semiconductor sintered body comprising a polycrystalline body, wherein the polycrystalline body includes silicon or a silicon alloy, an average particle size of crystal grains forming the polycrystalline body is 1 μm or less, and the semiconductor sintered body has an electrical conductivity of 10,000 S/m or higher.

Advantageous Effects of Invention

According to an embodiment of the present invention, a semiconductor material having an increased electrical conductivity and maintaining a reduced thermal conductivity is provided to achieve an improvement in thermoelectric performance.

DESCRIPTION OF EMBODIMENTS

Embodiments according to the present invention will now be described in more detail. The present invention is not limited to the embodiments described in the specification, and combinations and improvements of the embodiments can be appropriately made without departing from the technical idea of the invention.

(Semiconductor Sintered Body)

An embodiment of the present invention is a semiconductor sintered body including a polycrystalline body, wherein the polycrystalline body includes silicon or a silicon alloy, crystal grains forming the polycrystalline body have an average grain size of 1 μm or less, and the semiconductor sintered body has an electrical conductivity of 10,000 S/m or higher. Further, a semiconductor sintered body according to an embodiment of the present invention is a polycrystalline body including silicon or a silicon alloy, wherein crystal grains forming the polycrystalline body have an average grain size of 1 μm or less, and the semiconductor sintered body has an electrical conductivity of 10,000 S/m or higher.

For evaluating a thermoelectric performance (also referred to as thermoelectric conversion performance) of a thermoelectric material, a dimensionless thermoelectric performance index ZT[–] is generally used. The ZT is calculated by the following equation.

$$ZT = \alpha^2 \sigma T / \kappa \qquad (1)$$

In the equation (1), $\alpha$ [V/K] represents a Seebeck coefficient, $\sigma$ [S/m] represents an electric conductivity ("S" stands for Siemens and "m" stands for meter in the unit "S/m"), $\kappa$ [W/(mK)] represents a thermal conductivity, and T represents an absolute temperature [K]. The Seebeck coefficient $\alpha$ means an electrical potential difference generated per unit temperature difference. The larger the thermoelectric performance index ZT, the better the thermoelectric conversion performance. As is obvious from the equation (1), to improve the thermoelectric conversion performance ZT, a larger Seebeck coefficient $\alpha$ and a higher electrical conductivity $\sigma$, and a lower thermal conductivity $\kappa$ are desirable.

Silicon is known to have a high Seebeck coefficient $\alpha$, and the above-described configuration according to the present embodiment can provide a semiconductor sintered body having a lower thermal conductivity $\kappa$ and a higher electrical conductivity $\sigma$, thereby improving the thermoelectric performance index ZT in equation (1). Further, silicon is less toxic and less expensive than materials such as $Bi_2Te_3$ and PbTe. Therefore, by using a semiconductor sintered body according to the present embodiment, it is possible to provide an environment-friendly thermoelectric conversion element (thermoelectric power generation element) and thus a thermoelectric power generation device at low cost.

(Composition of Polycrystalline Body)

A semiconductor sintered body according to an embodiment of the present invention is a polycrystalline body including silicon. Specifically, the semiconductor sintered body may preferably be a silicon-based polycrystalline body or silicon alloy-based polycrystalline body, that is, a polycrystalline body including silicon or a silicon alloy as a main crystal. The main crystal means a crystal with a highest precipitation proportion in the XRD pattern or the like, and preferably is a crystal that accounts for 55% by mass or more of the total polycrystalline body.

When the semiconductor sintered body is a polycrystalline body including a silicon alloy, the polycrystalline body may be a solid solution, a eutectic body, or an intermetallic compound of silicon and an element other than silicon. The element other than silicon included in the silicon alloy is not particularly limited as long as the element does not interfere with the effect of the present embodiment such that the electrical conductivity can be increased while maintaining the low thermal conductivity of the sintered body, and may include Ge, Fe, Cr, Ta, Nb, Cu, Mn, Mo, W, Ni, Ti, Zr, Hf, Co, Ir, Pt, Ru, Mg, Ba, C, Sn, and the like. Such element may be included alone or in combination of two or more in the silicon alloy. Further, the silicon alloy preferably includes 2 to 20% by mass of one or two or more of the above-mentioned elements other than silicon. The silicon alloy may preferably be a silicon-germanium alloy, a silicon-tin alloy, or a silicon-lead alloy. Among such alloys, the silicon-germanium alloy is more preferred in light of the reduction of the thermal conductivity.

The semiconductor sintered body is a polycrystalline body having a so-called nanostructure, in which the average grain size of the crystal grains forming the polycrystalline body is 1 µm or less. Further, the average grain size of the crystal grains is preferably less than 1 µm, more preferably 800 nm or less, more preferably 500 nm or less, even more preferably 300 nm or less, and even more preferably 150 nm or less. Within the above range of the grain size of the crystal grains, the size of the crystal grains can be smaller than an average free path of phonons in the polycrystalline body, and thus the thermal conductivity can be reduced by phonon scattering at the interface.

Further, the lower limit of the average grain size of the crystal grains is not particularly limited, but may be not less than 1 nm in light of restriction in the manufacture.

In the specification, the average grain size of the crystal grains means a median value of a longest diameter of individual crystal grains forming the crystalline body, directly measured in an observation by a microscope such as a scanning electron microscope (SEM) or a transmission electron microscope (TEM).

The electrical conductivity of the semiconductor sintered body may be 10,000 S/m or higher, preferably 50,000 S/m or higher, more preferably 90,000 S/m or higher, more preferably 100,000 S/m or higher, and even more preferably 110,000 S/m or higher. The above electrical conductivity may be a value at 27° C. Such enhancement in the electrical conductivity allows for improving the thermoelectric performance. Further, the upper limit of the electrical conductivity of the semiconductor sintered body may be 600,000 S/m or lower, and may be 400,000 S/m or lower at 27° C.

The thermoelectric performance ZT may be, for example, 0.2 or greater, preferably 0.3 or greater, and more preferably 0.4 or greater at 527° C.

The thermal conductivity of the semiconductor sintered body according to the present embodiment is preferably 25 W/m·K or lower, and more preferably 10 W/m·K or lower. The above thermal conductivity may be a value at 27° C. Further, the absolute value of the Seebeck coefficient of the semiconductor sintered body is preferably 50 to 150 µV/K, and more preferably 80 to 120 µV/K. The above absolute value may be a value at 27° C.

(Dopant)

The semiconductor sintered body of the present embodiment may comprise an n-type dopant or a p-type dopant depending on usage. Preferably, the dopants are uniformly dispersed in the entire sintered body. The n-type dopant may preferably include phosphorus, arsenic, antimony, and bismuth, and these can be included in the semiconductor sintered body alone or in combination of two or more. The p-type dopant may preferably include boron, aluminum, gallium, indium, and thallium, and these can be included in the semiconductor sintered body alone or in combination of two or more. The conductivity types of the above-described dopant elements are merely examples. Whether the dopant element functions as an n-type dopant or p-type dopant depends on the type of the element forming the parent crystal, the structure of the crystal, etc. in the resulting sintered body.

In the case of the n-type dopant, the dopant concentration in the sintered body is preferably 0.1 to 10, and more preferably 0.5 to 5 in terms of [$10^{20}$ atoms/cm$^3$]. In the case of the p-type dopant, the dopant concentration in the sintered body is preferably 0.1 to 10, and more preferably 0.5 to 5 in terms of [$10^{20}$ atoms/cm$^3$]. The increased dopant concentration enables to enhance the electrical conductivity, and thus improve the thermoelectric performance ZT. However, when the dopant concentration is excessively high, the Seebeck coefficient may be decreased and the thermal conductivity may be increased, and thus the thermoelectric performance ZT may be decreased. However, the above range of the dopant concentration can improve the thermoelectric performance ZT.

The n-type dopant is preferably included at a concentration such that the Seebeck coefficient of the semiconductor sintered body is maintained in the range of −185 to −60 µV/K. The p-type dopant is preferably included at a concentration such that the Seebeck coefficient of the semiconductor sintered body is maintained in the range of 60 to 185 µV/K.

(Electrical and Electronic Material)

As described above, according to the present embodiment, a semiconductor sintered body can be provided, which has an increased electrical conductivity while maintaining a low thermal conductivity. Accordingly, the semiconductor sintered body can be used as an electrical member and/or an electronic member, a thermoelectric element in particular. More specifically, the semiconductor sintered body can be preferably used in a power generation device using exhaust heat, including a power generation device mounted on a generator or an exhaust system of an automobile or a ship, a power generation device mounted on a heat radiation system of a heating furnace used for industrial purposes, and the like.

(Method of Producing Semiconductor Sintered Body)

A method of producing a semiconductor sintered body according to the present embodiment comprises steps of: preparing particles including silicon or a silicon alloy and having an average particle size of 1 μm or less; forming a coating of an organic compound including a dopant element, on a surface of the particles; and sintering the particles with the coating formed on the surface to obtain a semiconductor sintered body.

In the step of preparing particles including silicon or a silicon alloy having an average particle size of 1 μm or less, for example, particles (powder) having an average particle size of 1 μm or less may be prepared by melting a material of silicon or a silicon alloy that is to be a main crystal followed by cooling to a solid state, and pulverizing the resulting solid by a known method. The particles (powder) may also be synthesized from a raw material of silicon or a silicon alloy by a known crystal growth method such as chemical vapor deposition (CVD).

The average particle size obtained in the step of preparing particles is preferably less than 1 μm, more preferably 800 nm or less, more preferably 500 nm or less, and even more preferably 300 nm or less. Further, the D90 size of the particles may be 1 μm or less, preferably 500 nm or less, and more preferably 200 nm or less. The above-described range of the particle size of the particles before sintering may result in a sintered body that includes crystal grains having a grain size of 1 μm or less and is appropriately densified. The lower limit of the average particle size to be prepared in the step of preparing particles is not limited, but the average particle size may preferably be 10 nm or greater in light of restriction in the manufacture. In the specification, the average particle size of the particles can be defined as a median diameter on a volumetric basis measured by a laser diffraction particle size distribution measuring device.

Subsequently, the step of forming a coating of an organic compound including a dopant element on the surface of the particles obtained in the step of preparing particles is performed. The step of forming a coating can be performed by dispersing the particles obtained in the step of preparing particles in a solvent, adding an organic compound including the above-described dopant element, and mixing by a bead mill or the like. The organic compound including the dopant element may be in a form of a mixture when added to the particle dispersion. Thereafter, the solvent is removed by decompression or the like, followed by drying to obtain particles with a coating of the organic compound including the dopant element formed on the surface. The coating may have a thickness of 0.5 to 5 nm, and preferably be a monomolecular film of the organic compound.

The dopant element to be included in the organic compound may be an n-type or p-type dopant element depending on the usage. The n-type dopant element may be one or two or more elements selected from phosphorus, arsenic, antimony, and bismuth. The p-type dopant element may be one or two or more elements selected from boron, aluminum, gallium, indium, and thallium.

The organic compound including the dopant element may be a high-molecular weight compound or a low-molecular weight compound. The organic compound may be a hydride, an oxide, an oxo acid, or the like.

When phosphorus is used as an n-type dopant element, the organic compound may be phosphoric acid, an alkylphosphonic acid, an alkylphosphinic acid, and esters thereof, a polyvinylphosphonic acid, phosphine, a trialkylphosphine such as triethylphosphine or tributylphosphine, or the like. Polymers including a phosphonic acid (phosphonic acid polymers) may also be used. When arsenic is used as the dopant element, arsine or the like may be used. In the case of antimony, antimony trioxide or the like may be used. In the case of bismuth, bismuth acid or the like may be used.

When boron is used as the p-type dopant element, a borane cluster such as decaborane or ortho-decaborane, boron trifluoride, or the like may be used as the organic compound. Further, when aluminum is used as the dopant element, aluminum trichloride, trimethylaluminum, or the like may be used. In the case of gallium, gallium trichloride, trimethylgallium, or the like may be used. In the case of indium, indium trichloride or the like may be used. In the case of thallium, thallium chloride or the like may be used. The above-mentioned organic compound may be used alone or in combination of two or more.

In the step of forming a coating, the organic compound including the dopant element may be added in an amount of preferably 3 to 60 parts by mass, more preferably 10 to 30 parts by mass, with respect to 100 parts by mass of the particles prepared in the step of preparing particles.

The method for the step of sintering may not be limited as long as the above-described raw particles (powder) can be sintered, but may include spark plasma sintering (SPS), atmospheric sintering (two step sintering), pressure sintering (hot pressing), hot isometric pressing (HIP), microwave sintering, and the like. Among such methods, the spark plasma sintering is preferred, which can produce smaller crystal grains.

The sintering temperature in the step of sintering may be selected depending on the composition of the silicon or silicon alloy main crystal to be obtained, but is preferably 900° C. or higher, and more preferably 1000° C. or higher. Further, the sintering temperature is preferably 1400° C. or lower, and more preferably 1300° C. or lower. The above range of the temperature can promote a densification of the sintered body, and maintain the average grain size of the polycrystalline grain of 1 μm or less.

Further, a rate of temperature rise in the step of sintering is preferably 10 to 100° C./minute, and more preferably 20 to 60° C./minute. The range of the rate of temperature rise enables to facilitate a uniform sintering and to suppress an excessively rapid grain growth to maintain the average grain size of the polycrystalline grains of 1 μm or less.

In the step of sintering, pressure is preferably applied. In that case, the pressure to be applied is preferably 10 to 120 MPa, and more preferably 30 to 100 MPa.

The present embodiment is a semiconductor sintered body produced by preparing particles including silicon or a silicon alloy and having an average particle size of 1 μm or less; forming a coating of an organic compound including a dopant element on a surface of the particles; and sintering the particles with the coating formed on the surface to obtain a semiconductor sintered body. Such a semiconductor sintered body has a high electrical conductivity while maintaining a low thermal conductivity. Therefore, a semiconductor sintered body having high thermoelectric performance ZT can be provided.

As described above, by sintering the particles with the coating including dopant elements on the surface, the dopant elements are thermo-diffused from the interface between the particles to the interior of the particles. Such doping by the thermodiffusion from the particle interface can improve the resulting electrical conductivity of the sintered body. Further, the semiconductor sintered body obtained by the method according to the present embodiment may also exhibit a higher electrical conductivity, compared to a sintered body having an equivalent dopant concentration but having been doped without utilizing thermodiffusion from the particle interface.

As described above, in the method according to the present embodiment, the doping is performed by incorporating the dopant element in the coating in the step of forming a coating, and thermodiffusing the dopants from the particle interface in the sintering step. However, dopants may additionally be incorporated in the particles in the step of preparing particles, followed by the above-described step of forming a coating. For example, at a stage of melting a silicon material or a silicon alloy material that is to be a main crystal, an elemental substance of the dopant element or a compound thereof may be added and mixed, and then the obtained particles (powder) may be cooled and ground, to prepare particles (powder) containing a dopant. Further, when particles are prepared using a chemical vapor deposition (CVD) or the like, raw material of silicon or a silicon alloy and an elemental substance of a dopant element or compound thereof may be mixed in a gas phase, and then condensed to prepare particles containing a dopant.

In the above-described manner, a higher doping concentration is achieved by incorporating dopants in the step of preparing particles, and then thermodiffusing the dopants from the particle surface into the inside of the particles in the step of forming a coating and the step of sintering.

EXAMPLES

[N-Type Semiconductor Sintered Body]

Example 1

(Preparation of Silicon Particles)

28 g of elemental silicon (purity: 99.99% or greater) and 1.0 g of elemental phosphorus (purity: 99.9%) were melted under an argon atmosphere in an arc melting apparatus, followed by cooling. The mass obtained by cooling was tumbled, and again melted and cooled. The cycle of the melting and the cooling was repeated four times in total to obtain a dopant-containing silicon material as a base material. The silicon material was then crushed to a size of 45 μm or less using a hammer crusher and a planetary ball mill. Further, a bead mill was used to pulverize to have a D90 size of approximately 150 nm. In the pulverizing, isopropyl alcohol was used as a medium, and zirconia beads with a diameter of 0.05 mm were used as the beads. Isopropyl alcohol was removed from the resulting slurry under reduced pressure followed by drying to provide silicon particles.

(Coating of Particles)

The resulting silicon particles were dispersed in heptane, and then polyvinylphosphonic acid (from Sigma Aldrich Co. Ltd.) was added in an amount of 1.0 g with respect to 5.0 g of silicon particles to obtain a mixture. The mixture was loaded in the above-mentioned bead mill, and a mixing process was performed for 300 minutes. Subsequently, the heptane was removed under reduced pressure followed by drying to provide silicon particles coated with a monomolecular film.

(Sintering)

The silicon particles coated with the monomolecular film were loaded in a punch-die jig made of graphite, and heated to 1200° C. using a spark plasma sintering apparatus to obtain a sintered body. The applied pressure was 80 MPa, and the rate of temperature rise was 50° C./minute. The outer surface of the obtained sintered body was roughly polished to remove the impurity layer originated from the graphite or the like. The sintered body was further cut by using a dicing saw to obtain a rectangular parallelepiped chip.

(Structure and Properties)

The density of the sintered body measured by Archimedes method was 98.5% with respect to the density of pure silicon. Further, a cross-section of the sintered body was observed under a transmission electron microscope (TEM), and a structure was observed in which silicon crystal grains with an average grain size of 100 nm were tightly bonded.

The sintered body had an electrical conductivity of $1.1 \times 10^5$ S/m at 27° C., and a thermal conductivity was 10.5 W/m·K. The dopant concentration was calculated based on the Seebeck coefficient (−89.2 μV/K) of the sintered body, and was 2.3 in terms of [$10^{20}$ atoms/cm$^3$]. The thermoelectric performance index ZT at 527° C. was 0.30.

Example 2

(Preparation of Silicon Particles)

Silicon particles were prepared as in Example 1.

(Coating of Particles)

Silicon particles coated with a monomolecular film were prepared in the same manner as in Example 1, except that 1.6 g of tributylphosphine was added to obtain a mixture instead of 1.0 g of polyvinylphosphonic acid.

(Sintering)

In the same manner as in Example 1, the silicon particles coated with the monomolecular film were sintered to obtain a sintered body, and a rectangular parallelepiped chip was obtained.

(Structure and Properties)

The density of the sintered body measured by Archimedes method was 98.5% with respect to the density of pure silicon. A cross-section of the sintered body was observed under a transmission electron microscope (TEM), and a structure was observed in which silicon grains with an average grain size of 100 nm were tightly bonded.

The sintered body had an electrical conductivity of $1.0 \times 10^5$ S/m at 27° C., and a thermal conductivity of 10.0 W/m·K. The dopant concentration was calculated based on the Seebeck coefficient (−94.9 μV/K) of the sintered body, and was 2.1 in terms of [$10^{20}$ atoms/cm$^3$]. The thermoelectric performance index ZT at 527° C. was 0.29.

Example 3

(Preparation of Silicon Particles)

Silicon particles were prepared in the same manner as in Example 1.

(Coating of Particles)

Silicon particles coated with a monomolecular film were prepared in the same manner as in Example 1, except that 1.0 g of methylphosphonic acid was added to obtain a mixture instead of 1.0 g of polyvinylphosphonic acid.

(Sintering)

In the same manner as in Example 1, the silicon particles coated with a monomolecular film were sintered to obtain a sintered body, and a rectangular parallelepiped chip was obtained.

(Structure and Properties)

The density of the sintered body measured by Archimedes method was 98.5% with respect to the density of pure silicon. A cross-section of the sintered body was observed under a transmission electron microscope (TEM), and a structure was observed in which silicon crystal grains with an average grain size of 100 nm were tightly bonded.

The sintered body had an electrical conductivity of $1.1 \times 10^5$ S/m at 27° C., and a thermal conductivity of 10.5 W/m·K. The dopant concentration was calculated based on

Example 3A (Preparation of Silicon Particles)

Silicon particles were prepared in the same manner as in Example 1.

(Coating of Particles)

Silicon particles coated with a monomolecular film were obtained in the same manner as in Example 1, except that 1.1 g of a phosphonic acid polymer mixture (phosphorous content: 22 wt %, developed by Nitto Denko Corporation, No. DB81) was added to obtain a mixture instead of 1.0 g of polyvinylphosphonic acid.

(Sintering)

In the same manner as in Example 1, the silicon particles coated with the monomolecular film were sintered to obtain a sintered body, and a rectangular parallelepiped chip was obtained.

(Structure and Properties)

The density of the sintered body measured by Archimedes method was 98.5% with respect to the density of pure silicon. A cross-section of the sintered body was observed under a transmission electron microscope (TEM), and a structure was observed in which silicon crystal grains with an average grain size of 100 nm were tightly bonded.

The sintered body had an electrical conductivity of $1.2 \times 10^5$ S/m at 27° C., and a thermal conductivity of 10.0 W/m·K. The dopant concentration was calculated based on the Seebeck coefficient (−90.1 μV/K) of the sintered body, and was 2.3 in terms of $[10^{20}$ atoms/cm$^3]$. The thermoelectric performance index ZT at 527° C. was 0.31.

Example 4

(Preparation of Silicon Particles)

Silicon particles were obtained in the same manner as in Example 1, except that 0.5 g of elemental phosphorus (purity: 99.9%) and 3.5 g of elemental bismuth (purity: 99.99% or greater) were used instead of 1.0 g of elemental phosphorus (purity: 99.9%).

(Coating of Particles)

In the same manner as in Example 1, silicon particles coated with a monomolecular film were obtained.

(Sintering)

In the same manner as in Example 1, the silicon particles coated with a monomolecular film were sintered to obtain a sintered body, and a rectangular parallelepiped chip was obtained.

(Structure and Properties)

The density of the sintered body measured by Archimedes method was 98.5% with respect to the density of pure silicon. A cross-section of the sintered body was observed under a transmission electron microscope (TEM), and a structure was observed in which silicon crystal grains with an average grain size of 100 nm were tightly bonded.

The sintered body had an electrical conductivity of $1.2 \times 10^5$ S/m at 27° C., and a thermal conductivity of 9.0 W/m·K. The dopant concentration was calculated based on the Seebeck coefficient (−93.5 μV/K) of the sintered body, and was 2.1 in terms of $[10^{20}$ atoms/cm$^3]$. The thermoelectric performance index ZT at 527° C. was 0.40.

Example 5

(Preparation of Silicon Particles)

The raw materials, 100 molar equivalents of monosilane (SiH$_4$, purity: 99.9%) and 3 molar equivalents of phosphine (PH$_3$, purity 99.9%) were reacted in a microwave plasma reactor under flowing of an argon/hydrogen mixture gas to synthesize nanoparticles, which were collected by an in-line filter. The silicon nanoparticles were obtained as aggregates with an average particle size of approximately 150 nm, and an average size of the crystallites was 10 nm.

(Coating of Particles)

In the same manner as in Example 1, silicon particles coated with a monomolecular film were obtained.

(Sintering)

In the same manner as in Example 1, the silicon particles coated with a monomolecular film were sintered to obtain a sintered body, and a rectangular parallelepiped chip was obtained.

(Structure and Properties)

The density of sintered bodies measured by Archimedes method was 98.5% with respect to the density of pure silicon. A cross-section of the sintered body was observed under a transmission electron microscope (TEM), and a structure was observed in which silicon crystal grains with an average grain size of 100 nm were tightly bonded.

The sintered body had an electrical conductivity of $0.9 \times 10^5$ S/m at 27° C. and a thermal conductivity of 8.4 W/m·K. The dopant concentration was calculated based on the Seebeck coefficient (−95.0 μV/K) of the sintered body, and was 2.0 in terms of $[10^{20}$ atoms/cm$^3]$. The thermoelectric performance index ZT at 527° C. was 0.50.

Example 6

(Preparation of Silicon Alloy Particles)

Particles were prepared in the same manner as in Example 1, except that 28 g of elemental silicon (purity: 99.99% or greater) and 3.0 g of elemental germanium (purity: 99.99% or greater) were used instead of 28 g of elemental silicon (purity: 99.99% or greater), and the amount of the elemental phosphorus (purity: 99.9%) was changed to 0.5 g.

(Coating of Particles)

In the same manner as in Example 1, silicon alloy particles were coated to obtain silicon alloy particles coated with a monomolecular film.

(Sintering)

In the same manner as in Example 1, the silicon alloy particles coated with a monomolecular film were sintered to obtain a sintered body, and a rectangular parallelepiped chip was obtained.

(Structure and Properties)

The density of the sintered body measured by Archimedes method was 98.5% with respect to the density of the silicon alloy before grinding. A cross-section of the sintered body was observed under a transmission electron microscope (TEM), and a structure was observed in which silicon crystal grains with an average particle size of 100 nm were tightly bonded.

The sintered body had an electrical conductivity of $1.2 \times 10^5$ S/m at 27° C., and a thermal conductivity of 4.2 W/m·K. The dopant concentration was calculated based on the Seebeck coefficient (−82.3 μV/K) of the sintered body, and was 3.1 in terms of [$10^{20}$ atoms/cm$^3$]. The thermoelectric performance index ZT at 527° C. was 0.54.

[P-Type Semiconductor Sintered Body]

Example 7

(Preparation of Silicon Particles)

28 g of elemental silicon (purity: 99.99% or greater) and 0.5 g of monomeric boron (purity: 99.9%) were melted under an argon atmosphere in an arc melting apparatus, followed by cooling. The mass obtained by cooling was tumbled and again melted and cooled. The cycle of melting and cooling was repeated four times in total to obtain a dopant-containing silicon material as a base material. The silicon material was then crushed to a size of 45 μm or less using a hammer crusher and a planetary ball mill. Further, a bead mill was used to pulverize to have a D90 size of approximately 150 nm. In the pulverizing, isopropyl alcohol was used as a medium, and zirconia beads with a diameter of 0.05 mm were used as the beads. Isopropyl alcohol was removed from the resulting slurry under reduced pressure followed by drying to provide silicon particles.

(Coating of Particles)

The resulting silicon particles were dispersed in heptane, and decaborane was added in an amount of 0.5 g with respect to 5.0 g of silicon particles to obtain a mixture. The mixture was loaded in the above-mentioned bead mill, and a mixing process was performed for 300 minutes. The heptane was then removed under reduced pressure followed by drying to provide silicon particles coated with a monomolecular film.

(Sintering)

The silicon powder coated with the monomolecular film was loaded in a punch-die jig made of graphite and heated to 1200° C. using a spark plasma sintering apparatus to obtain a sintered solid. The applied pressure was 80 MPa, and the rate of temperature rise was 50° C./minute. The surface of the sintered body was roughly polished to remove the impurity layer originated from the graphite or the like. The sintered body was further cut by a dicing saw to obtain a rectangular parallelepiped chip.

(Structure and Properties)

The density of the sintered body measured by Archimedes method was 98.5% with respect to the density of pure silicon. A cross-section of the sintered body was observed under a transmission electron microscope (TEM), and a structure was observed in which silicon particles with an average grain size of 100 nm were tightly bonded.

The sintered body had an electrical conductivity of 1.1× $10^5$ S/m at 27° C., and a thermal conductivity of 12.0 W/m·K. The dopant concentration was calculated based on the Seebeck coefficient (89.4 μV/K) of the sintered body, and was 2.3 in terms of [$10^{20}$ atoms/cm$^3$]. The thermoelectric performance index ZT at 527° C. was 0.30.

Example 8

(Preparation of Silicon Particles)

Silicon particles were prepared in the same manner as in Example 7.

(Coating of Particles)

Silicon particles coated with a monomolecular film were obtained in the same manner as in Example 7, except that a mixture containing 1.6 g of tributylborane was used instead of 0.5 g of decaborane.

(Sintering)

In the same manner as in Example 7, the silicon particles coated with a monomolecular film were sintered to obtain a sintered body, and a rectangular parallelepiped chip was obtained.

(Structure and Properties)

The density of the sintered body measured by Archimedes method was 98.5% with respect to pure silicon. A cross-section of the sintered body was observed under a transmission electron microscope (TEM), and a structure was observed in which silicon grains with an average grain size of 100 nm were tightly bonded.

The sintered body had an electrical conductivity of 1.0× $10^5$ S/m at 27° C., and a thermal conductivity of 11.5 W/m·K. The dopant concentration was calculated based on the Seebeck coefficient (93.9 μV/K) of the sintered body, and was 2.1 in terms of [$10^{20}$ atoms/cm$^3$]. The thermoelectric performance index ZT at 527° C. was 0.31.

Example 9

(Preparation of Silicon Particles)

Silicon particles were prepared in the same manner as in Example 7.

(Coating of Particles)

In the same manner as in Example 7, silicon particles coated with a monomolecular film were obtained, except that a mixture containing 1.0 g of triethylborate instead of 0.5 g of decaborane was used.

(Sintering)

In the same manner as in Example 7, the silicon particles coated with a monomolecular film were sintered to obtain a sintered body, and a rectangular parallelepiped chip was obtained.

(Structure and Properties)

The density of the sintered body measured by Archimedes method was 98.5% with respect to the density of pure silicon. A cross-section of the sintered body was observed under a transmission electron microscope (TEM), and a structure was observed in which silicon grains with an average size of 100 nm were tightly bonded.

The sintered body had an electrical conductivity of 1.1× $10^5$ S/m at 27° C., and a thermal conductivity of 12.5 W/m·K. The dopant concentration was calculated based on the Seebeck coefficient (89.2 μV/K) of the sintered body, and was 2.3 in terms of [$10^{20}$ atoms/cm$^3$]. The thermoelectric performance index ZT at 527° C. was 0.30.

Example 10

(Preparation of Silicon Particles)

Silicon particles were prepared in the same manner as in Example 7, except that 0.5 g of elemental boron (purity: 99.9%) and 3.5 g of elemental gallium (purity: 99.99% or greater) were used instead of 0.5 g of elemental boron (purity: 99.9%).

(Coating of Particles)

In the same manner as in Example 7, silicon particles coated with a monomolecular film were obtained.

(Sintering)

In the same manner as in Example 7, the silicon powder coated with the monomolecular film was sintered to obtain a sintered body, and a rectangular parallelepiped chip was obtained.

The density of the sintered body measured by Archimedes method was 98.5% with respect to the density of pure silicon. A cross-section of the sintered body was observed under a transmission electron microscope (TEM), and a structure was observed in which silicon crystal grains with an average grain size of 100 nm were tightly bonded.

The sintered body had an electrical conductivity of $1.2 \times 10^5$ S/m at 27° C., and a thermal conductivity of 9.0 W/m·K. The dopant concentration was calculated based on the Seebeck coefficient (86.6 μV/K) of the sintered body, and was 2.5 in terms of $[10^{20}$ atoms/cm$^3]$. The thermoelectric performance index ZT at 527° C. was 0.31.

Example 11

(Preparation of Silicon Particles)

The raw materials, 100 molar equivalents of monosilane (SiH$_4$, purity: 99.9%) and 3 molar equivalents of diborane (B$_2$H$_4$, purity: 99.9%) were reacted in a microwave plasma reactor under flowing of an argon/hydrogen mixture gas to synthesize nanoparticles, which were collected by an in-line filter. The silicon nanoparticles were obtained as aggregates with an average particle size of approximately 150 nm, and the average size of the crystallite was 10 nm.

(Coating of Particles)

In the same manner as in Example 7, silicon particles coated with a monomolecular film were obtained.

(Sintering)

In the same manner as in Example 7, the silicon powder coated with the monomolecular film was sintered to obtain a sintered body, and a rectangular parallelepiped chip was obtained.

(Structure and Properties)

The density of the sintered body measured by Archimedes method was 98.5% with respect to the density of pure silicon. A cross-section of the sintered body was observed under a transmission electron microscope (TEM), a structure was observed in which silicon crystal grains with an average grain size of 100 nm were tightly bonded.

The sintered body had an electrical conductivity of $1.0 \times 10^5$ S/m at 27° C., and a thermal conductivity of 8.8 W/m·K. The dopant concentration was calculated based on the Seebeck coefficient (89.0 μV/K) of the sintered body, and was 2.3 in terms of $[10^{20}$ atoms/cm$^3]$. The thermoelectric performance index ZT at 527° C. was 0.30.

Example 12

(Preparation of Silicon Alloy Particles)

Particles were prepared in the same manner as in Example 7, except that 28 g of elemental silicon (purity: 99.99% or greater) and 3.0 g of elemental germanium (purity: 99.99% or greater) were used instead of 28 g of elemental silicon (purity: 99.99% or greater) to obtain silicon alloy particles.

(Coating of Particles)

In the same manner as in Example 7, silicon alloy particles with a monomolecular film coating were obtained.

(Sintering)

In the same manner as in Example 7, the silicon powder coated with the monomolecular film was sintered to obtain a sintered body, and a rectangular parallelepiped chip was obtained.

(Structure and Properties)

The density of the sintered body measured by Archimedes method was 98.5% with respect to the silicon alloy before grinding. A cross-section of the sintered body was observed under a transmission electron microscope (TEM), and a structure was observed in which silicon alloy grains with an average grain size of 100 nm were tightly bonded.

The sintered body had an electrical conductivity of $1.0 \times 10^5$ S/m at 27° C., and a thermal conductivity of 4.5 W/m·K. The dopant concentration was calculated based on the Seebeck coefficient (81.2 μV/K) of the sintered body and was 3.3 in terms of $[10^{20}$ atoms/cm$^3]$. The thermoelectric performance index ZT at 527° C. was 0.41.

The present application is based on and claims priority to Japanese Patent Application No. 2017-100107 filed on May 19, 2017; Japanese Patent Application No. 2017-100108 filed on May 19, 2017; and Japanese Patent Application No. 2017-199057 filed on Oct. 13, 2017, the entire contents of which are hereby incorporated by reference.

The invention claimed is:

1. A method of producing a semiconductor sintered body comprising:
   a step of preparing powder particles including silicon or a silicon alloy and having an average particle size of 1 μm or less;
   a step of forming a coating of an organic compound including a dopant element, on a surface of the powder particles by dispersing the powder particles in a solvent, adding the organic compound including the dopant element, and mixing, followed by removing the solvent by decompression; and
   a step of sintering the powder particles with the coating formed on the surface to obtain a semiconductor sintered body,
   wherein the organic compound comprises a phosphonic acid derivative or a polymer including a phosphonic acid.

2. The method according to claim 1, wherein the dopant element comprises one or more selected from phosphorus, arsenic, antimony, and bismuth.

3. The method according to claim 1, wherein the step of sintering is performed at a temperature of 900° C. or higher.

4. The method according to claim 1, wherein the step of sintering comprises spark plasma sintering.

5. The method according to claim 1, wherein the dopant element is chemically bonded to an element in the organic compound.

* * * * *